(12) United States Patent
Ho

(10) Patent No.: US 6,432,759 B1
(45) Date of Patent: Aug. 13, 2002

(54) METHOD OF FORMING SOURCE AND DRAIN REGIONS FOR CMOS DEVICES

(75) Inventor: Yu-Lam Ho, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/259,575

(22) Filed: Jun. 14, 1994

Related U.S. Application Data

(63) Continuation of application No. 07/982,093, filed on Nov. 24, 1992.

(51) Int. Cl.$^7$ .................................... H01L 21/8238
(52) U.S. Cl. ..................... 438/199; 438/227; 438/232
(58) Field of Search ............... 437/34, 45, 44, 437/56, 57, 58; 438/199

(56) References Cited

U.S. PATENT DOCUMENTS

| | | | | |
|---|---|---|---|---|
| 4,525,378 A | * | 6/1985 | Schwabe et al. | 427/38 |
| 4,760,033 A | * | 7/1988 | Mueller | 437/34 |
| 4,927,777 A | * | 5/1990 | Hsu et al. | 437/57 |
| 4,937,645 A | * | 6/1990 | Ootsuka et al. | 357/42 |
| 4,952,525 A | * | 8/1990 | van der Plas | 437/69 |
| 4,962,052 A | * | 10/1990 | Asayama et al. | 437/31 |
| 4,997,782 A | * | 3/1991 | Bergonzoni | 437/57 |
| 5,001,074 A | * | 3/1991 | Arnborg | 437/31 |
| 5,036,019 A | * | 7/1991 | Yamane et al. | 437/57 |
| 5,185,279 A | * | 2/1993 | Ushiku | 437/41 |
| 5,229,308 A | * | 7/1993 | Vo et al. | 437/31 |
| 5,393,685 A | * | 2/1995 | Yoo et al. | 437/44 |
| 5,399,154 A | * | 3/1995 | Ichikawa | 437/57 |
| 5,763,922 A | | 6/1998 | Chau | |
| 6,110,842 A | | 8/2000 | Okuno et al. | |

OTHER PUBLICATIONS

Wolf, S. "Silicon Processing for the VLSI Era", Lattice Press, Sunset Beach, CA. 1990, vol 2, pp. 354–361.*

* cited by examiner

*Primary Examiner*—Long Pham
*Assistant Examiner*—William David Coleman

(57) ABSTRACT

Method for producing an NMOS, PMOS or CMOS semiconductor device with reduced substrate current and increased device lifetime. A source-gate-drain device is fabricated having a moderately doped source region, a lightly doped source region, a gate or channel region, a lightly doped drain region, and a moderately doped drain region, arranged consecutively in that order, with the channel region adjacent to the gate having opposite electrical conductivity type to the electrical conductivity type of the source and drain regions. The source region and drain region are formed by ion implantation with ion kinetic energies of 40 keV or more, to increase the width and depth of charge carrier flow in these regions and to thereby reduce the substrate current associated with the device to less than one $\mu$Amp/$\mu$m. Ion implantation of the source and drain regions with ion kinetic energies of 70 keV or more decreases the hot-electron effect and increases the operating lifetime of the device by a multiplicative factor of 20 or more.

7 Claims, 14 Drawing Sheets

METHOD OF FORMING SOURCE AND DRAIN REGIONS FOR CMOS DEVICES

This is a continuation of application, Ser. No. 07/982,093 filed Nov. 24, 1992.

BACKGROUND OF THE INVENTION

1. Field of the Invention

This invention relates to semiconductor circuit fabrication, and more particularly to control of substrate current density in MOS and CMOS devices.

2. Background of the Invention

Metal-oxide-semiconductor (MOS) transistor circuits are often preferred over bipolar junction transistor circuits when low power and low current circuit operation is desired. In a representative MOS transistor that relies upon n type minority charge carriers, referred to as an NMOS transistor, two heavily doped n type regions are formed in a lightly doped p type substrate. The two n type regions (called source and drain) are spaced apart from one another by a distance of the order of one micron ($\mu$m) or less. The substrate region between these two n type regions becomes a p type channel through which n type (electron) minority charge can flow between the source and drain when a voltage difference is imposed between the source and drain regions. A voltage-controlled gate is provided over the channel region to control the distribution of p type charges (holes) in the channel. Application of a voltage to the gate provides a means to control the rate of minority charge flow (electrons) between source and drain in the channel.

In a representative PMOS transistor, two heavily doped p type regions are formed in a lightly doped n type substrate, separated by a channel of length of the order of 1 $\mu$m or less. A voltage-controlled gate is provided over the channel region to control the rate of minority charge flow (holes) between the p type source and p type drain.

In complementary MOS (CMOS) technology, an NMOS transistor and a PMOS transistor are fabricated adjacent to each other on the same substrate, which may initially be lightly doped or undoped. First and second wells of n type and p type, respectively, are formed in the substrate. One or more PMOS transistors are formed in the n type well, and one or more NMOS transistors are formed in the p type well. PMOS and NMOS transistors are paired together to create a CMOS device characterized by a very low standby current consumption. Circuits made from CMOS devices therefore require less power and generate less heat than equivalent circuits designed with NMOS or PMOS devices alone. CMOS circuitry is well suited for battery powered systems where low power consumption is often a critical design factor, and for extremely dense VLSI and ULSI circuitry where it becomes important to minimize the heat generated by the circuitry.

As CMOS device features decrease to sub-micron dimensions, the reliability of both NMOS and PMOS transistors becomes a concern, but more particularly the NMOS transistors. This is because a decrease in gate oxide thickness and an increase in current drive increases the possibility of the injection of very energetic conduction band electrons into the gate oxide region of an NMOS transistor in a phenomenon known as the "hot electron effect". A hot electron has energy much greater than the energy required to occupy an electron state in the conduction band of the material. Hot electrons may produce hole-electron pairs by impacting upon die lattice of die material, and may become trapped in the gate oxide, creating a permanent charge in die oxide layer.

A partial solution to the hot electron effect, known in the prior art, is the provision of a lightly doped drain (LDD) structure. With a lightly doped drain, the interface region between the drain and the channel of the transistor is doped more lightly than the drain itself. This reduces the energy of the electrons flowing into the drain, and reduces the hot electron effect. However, the LDD structure somewhat reduces the performance of the transistor and does not completely eliminate the hot electron effect.

Another problem encountered in the prior art is the lowering of the transistor's threshold voltage $V_{th}$ as the channel length of the transistor is shortened. A low threshold voltage can lead to leaky and otherwise defective transistors. As a general rule, the threshold voltage should be at least 0.5 or 0.6 volts to prevent leakage problems. Since the threshold voltage is inversely related to the energy of the ion implantation which creates the source and drain regions of the transistor, the trend is to lower the implant energy as the channel length decreases to maintain the threshold voltage at a reasonable level. Currently, for short channel MOS transistors, it is desirable to maintain the implant energy for the source and drain regions at 30 keV or less. Implant energies much above 30 keV were considered to produce an undesirably low threshold voltage in the transistors and, therefore, were undesirable.

The prior art does not disclose a method or structure for providing a controllable decrease in substrate current density near the gate structure to suppress the hot electron effect without substantially degrading the performance of the transistor. Preferably, any such decrease should be accomplished with at most a modest increase in complexity of the circuit fabrication process, and should preferably utilize materials and additives normally used in a circuit fabrication process.

SUMMARY OF THE INVENTION

These needs are met by the present invention, which provides a method and structure for reduced substrate current density in metal oxide semiconductor (MOS) devices by moving the high current channel center away from the gate structure and increasing the effective width of this channel. The method for manufacturing the improved MOS devices utilizes industry standard materials and equipment.

A method for fabricating a MOS device in accordance with the present invention includes the steps of: a) providing a channel region of a first conductivity type in a semiconductor substrate; b) providing a gate structure over the channel region; and c) implanting ions of a selected species of a second conductivity type, opposite the first conductivity type, in the substrate adjacent to tile channel region with an implant energy of at least 40 keV. This high energy implant creates a deep, wide channel which reduces substrate current density and which moves the substrate current away from the gate structure. These characteristics greatly reduce the hot electron effect and greatly increase the operational life of the transistor.

A transistor device in accordance with the present invention includes a semiconductor substrate, a channel region formed in the substrate, a gate structure formed over the channel region, a source region formed in the substrate on a first side of the channel region, a drain region formed in the substrate on a second side of the channel region, where the source region and the drain region have doping concentrations of no more than $5 \times 10^{18}$ cm$^{-3}$, and each of these two regions has a position of maximum doping concentration within the substrate which lies at least 0.06 $\mu$m below the gate structure. The provision of deep source and drain regions results in a deep channel, reducing the hot electron effect.

The method and structure of the present invention provides a source-gate-drain semiconductor device having substantially reduced peak current density in a channel region underlying and spaced from the gate structure. This procedure may be repeated, with n type and p type material interchanged, to produce a CMOS device.

This preferred approach produces an MOS transistor with several highly desirable features. First, the device has reduced peak substrate current density in a channel region underlying and adjacent to the gate structure of the device, because the current is spread over a wider channel. This allows use of smaller transistor channel length. Second, the hot electron effect is greatly reduced. Third, the lifetime of such a transistor increases dramatically, by a multiplicative factor of the order of 20 or more in some situations, depending upon the implant ion kinetic energies used. Fourth, these features are obtained with little or no increase in complexity of the processing steps.

These and other advantages of the present invention will become apparent to those skilled on the art upon a reading the following specification and a study of the accompanying figures.

DETAILED DESCRIPTION OF THE PREFERRED EMBODIMENTS

Figure 1A:
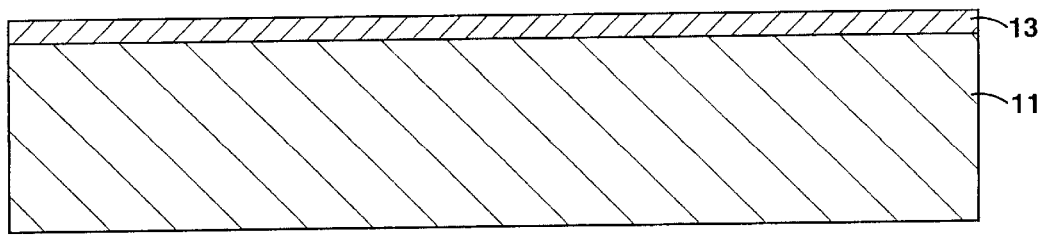
FIGS. 1A–1X illustrate preparatory steps performed in fabrication of a CMOS device in accordance with the present invention.
Figure 1B:
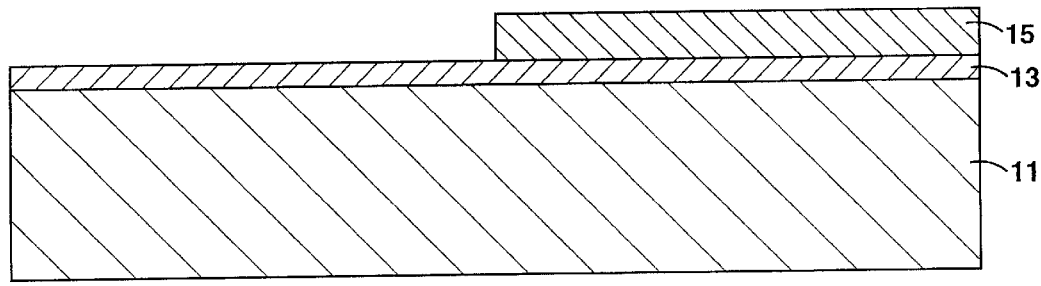
Figure 1C:
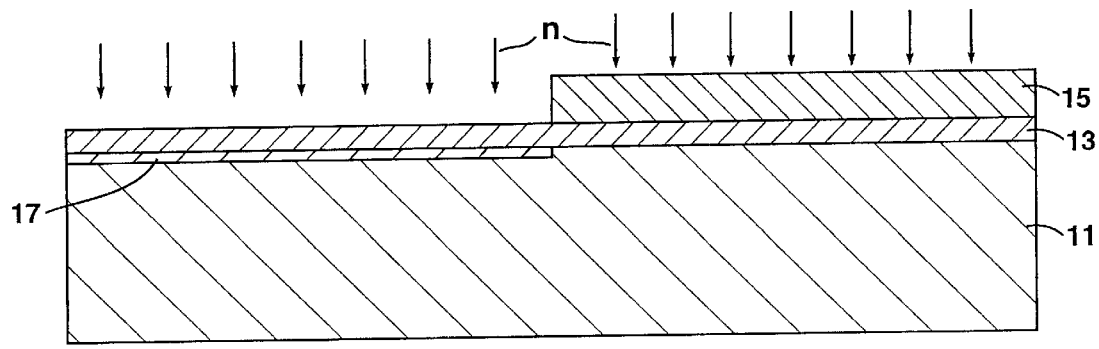
Figure 1D:
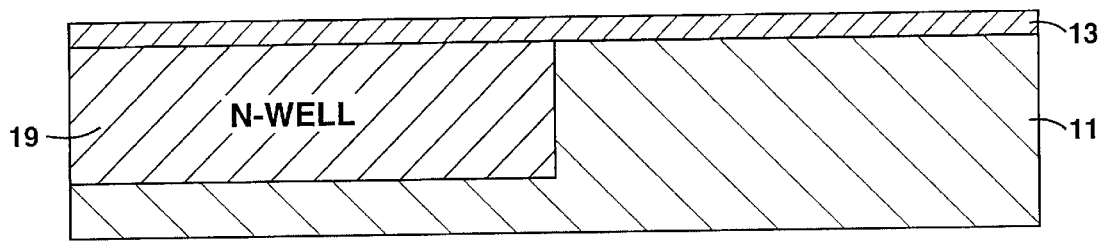
Figure 1E:
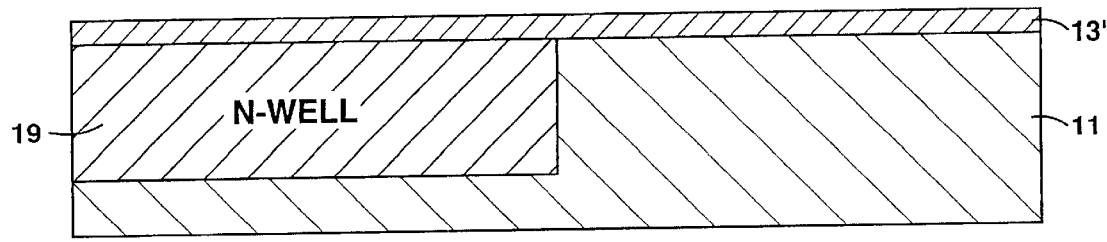
Figure 1F:
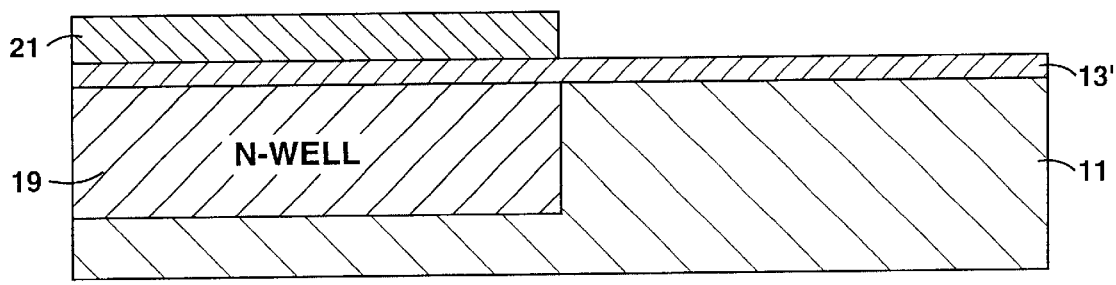
Figure 1G:
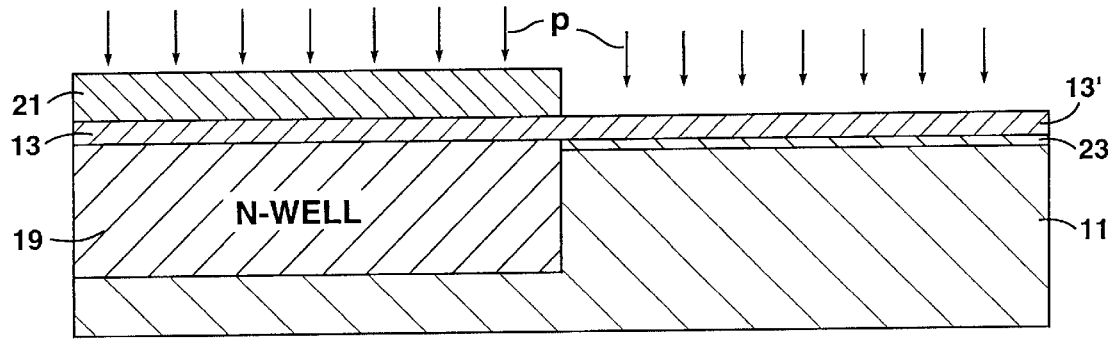
Figure 1H:
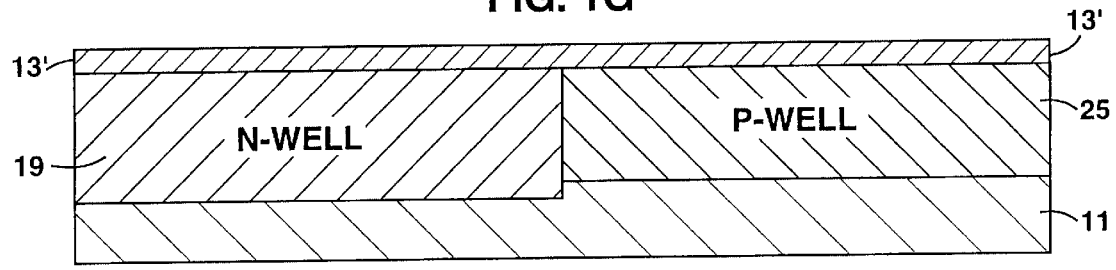
Figure 1I:
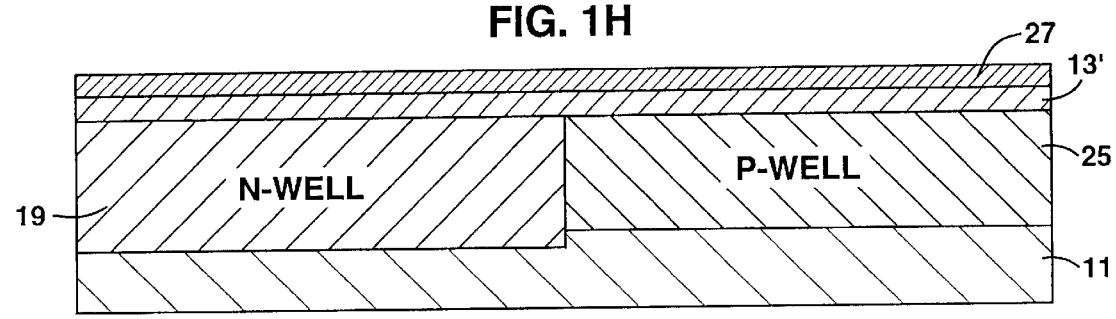
Figure 1J:
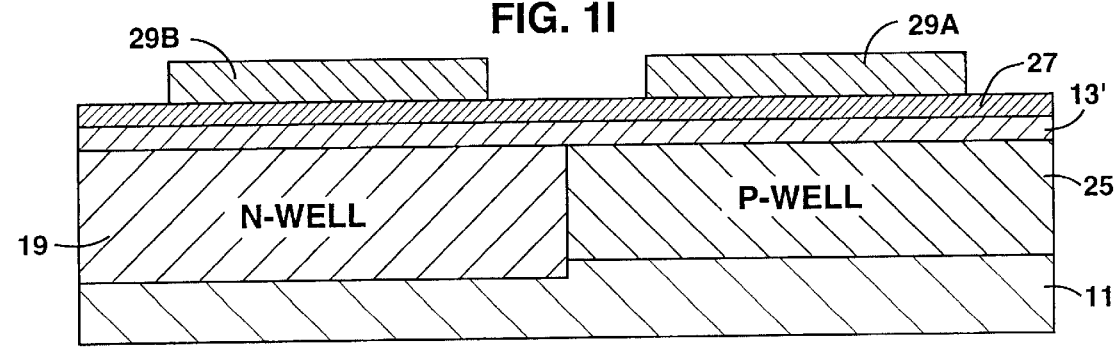
Figure 1K:
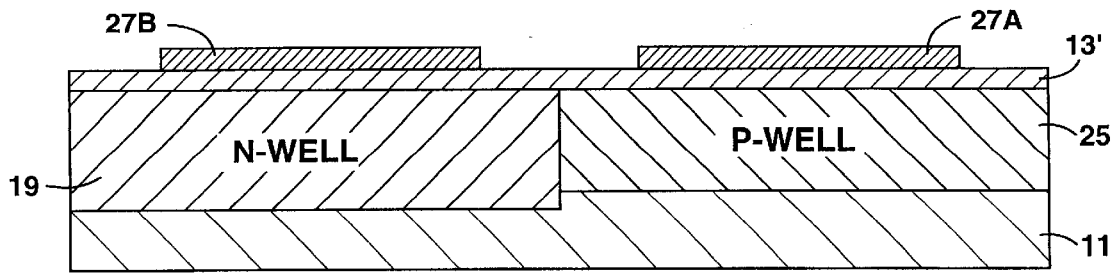
Figure 1L:
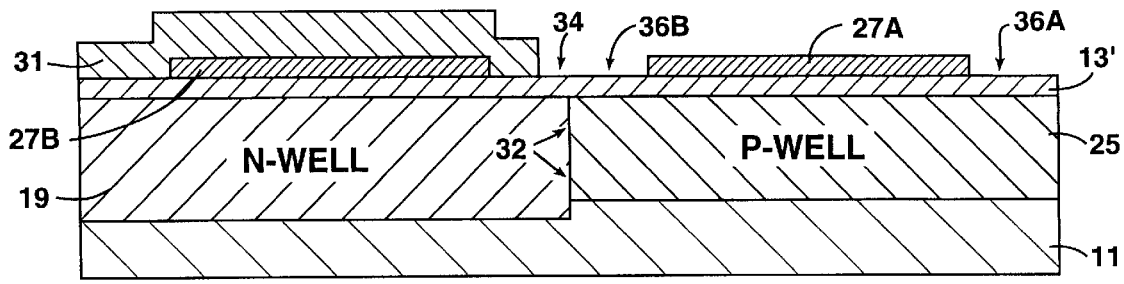
Figure 1M:
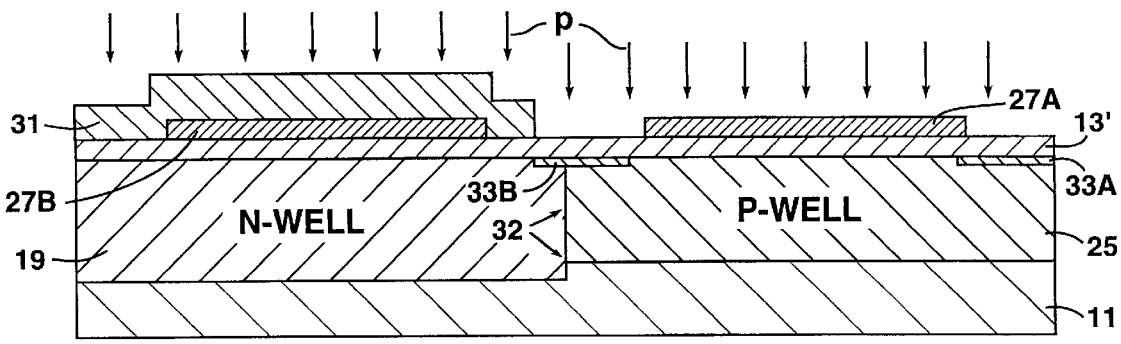
Figure 1N:
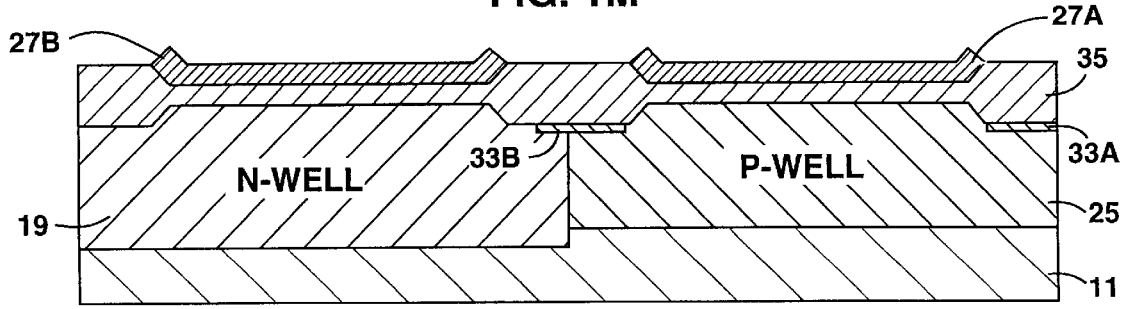
Figure 1O:
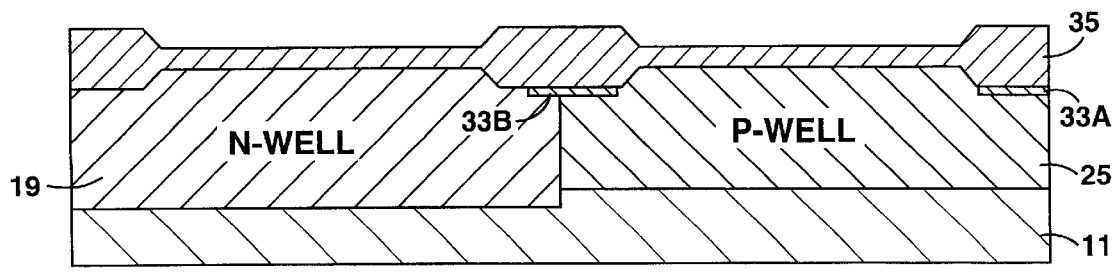
Figure 1P:
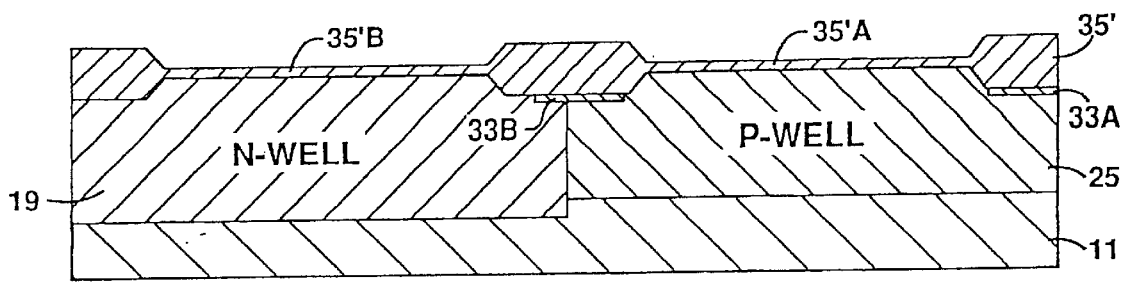
Figure 1Q:
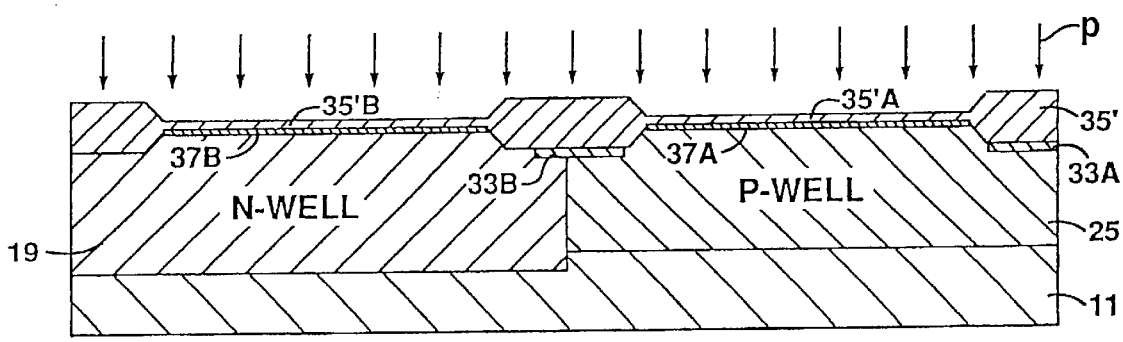
Figure 1R:
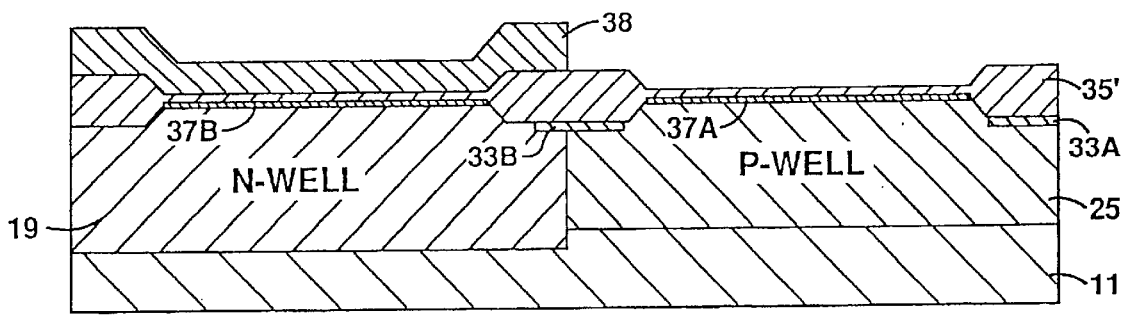
Figure 1S:
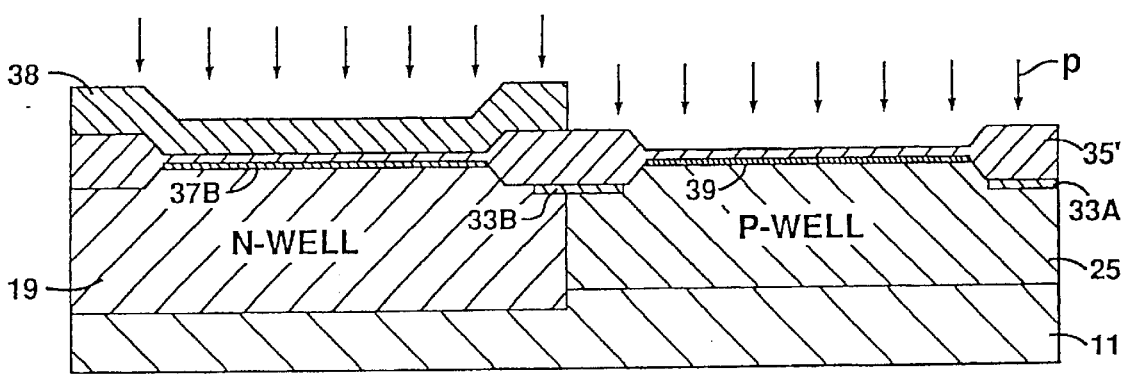
Figure 1T:
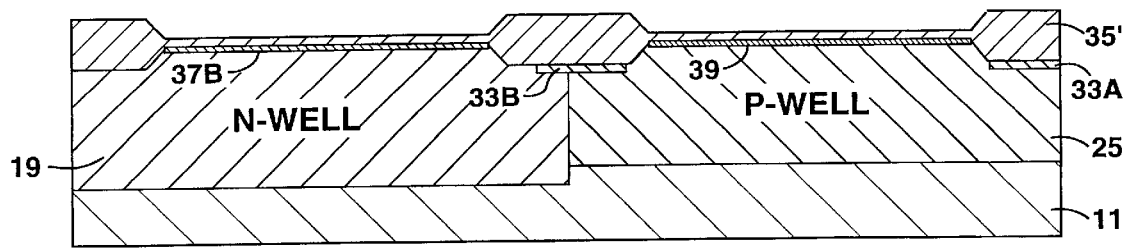
Figure 1U:
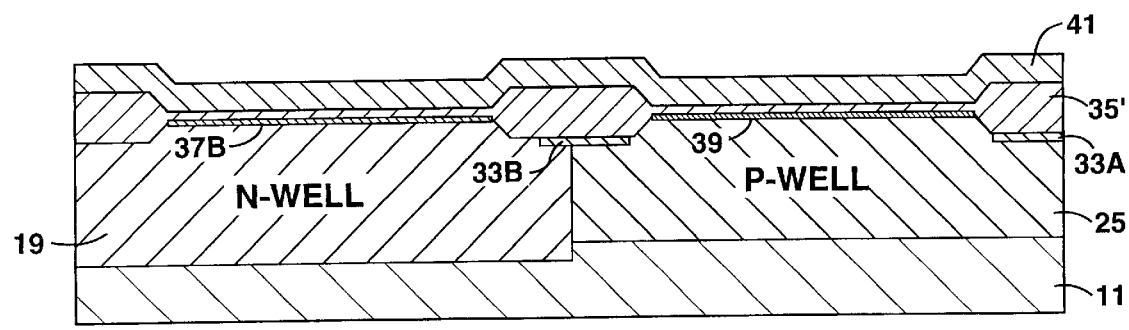
Figure 1V:
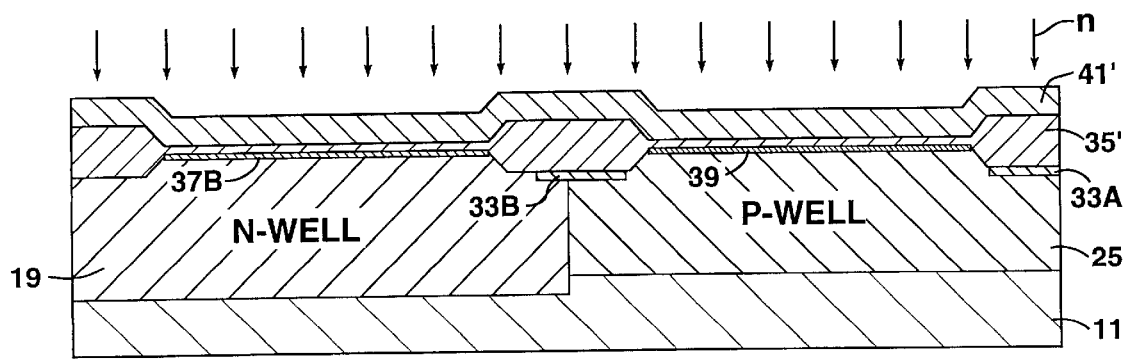
Figure 1W:
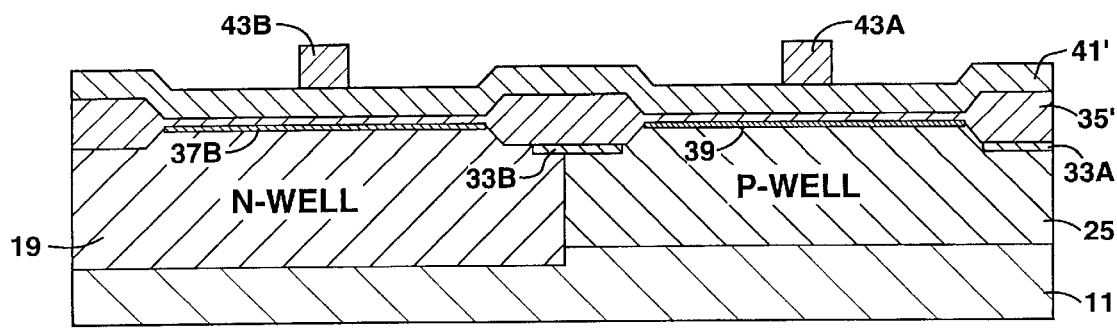
Figure 1X:
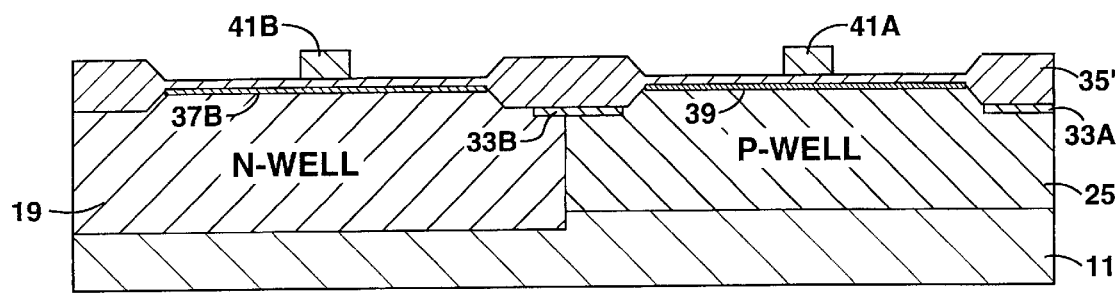

FIGS. 1A–1X illustrate initial or preparatory steps to be taken in fabrication of a CMOS device in accordance with the present invention. In FIG. 1A, a substrate 11 of silicon or other suitable semiconductor material is provided, and an oxide layer 13 is grown on an exposed surface (the "top surface") of the substrate. The oxide layer 13 preferably has a thickness in the range 0.01–0.5 μm, and may be grown using oxygen or water vapor at a temperature in the range T=850–1250° C.

In FIG. 1B, an ion implant mask 15 of photoresist or other suitable masking material is deposited over a selected portion (the "p-well portion") of the oxide layer 13. In FIG. 1C, an n type ion implant is performed over the substrate, penetrating the unmasked portion of the substrate (the "n-well portion") through the oxide layer 13. Preferably, the ion dose is in the range $10^{12}$–$10^{13}$ atoms/cm$^2$, the ion kinetic energy is in the range 20–400 keV, and the ion is an ionized n type atom or molecule drawn from a class that includes P, As, Sb, Sn and halogenated molecules that incorporate one of these n type atoms. With this choice of ions and ion energy, the ion implant range, as taught by S. K. Ghandi in *VLSI Fabrication Principles,* John Wiley & Sons, 1983, pp. 299–370 of an n type implant region 17 is about 100–6000 Angstroms ("Å").

In FIG. 1D, the mask 15 is removed and a high temperature drive (such as with a thermal annealer) with a temperature T=700–1300° C. is applied for a time interval Δt=10–1000 min. to drive the n type ions concentrated in the implant region 17 into the substrate 11 to form an n-well 19 in the substrate 11 contiguous to the oxide layer 13. In FIG. 1E, the oxide layer 13 is then removed with HF solution or by other means, and a new native oxide layer 13' covering the substrate 11 at the top surface thereof is grown at a temperature in the range T=700–1300° C.

In FIG. 1F, a mask 21 is deposited on the oxide layer 13', covering the n-well portion 19 of the substrate 11. In FIG. 1G, a p type ion implant (ion dose=$10^{12}$–$10^{13}$ atoms/cm$^2$; ion kinetic energies=10–400 keV and preferably about 150 keV; ions drawn from B, Al, Ga, BF$_2$ or a halogenated compound thereof) is performed over the substrate penetrating the p-well portion of the oxide layer 13'. With this choice of ion and ion kinetic energy, the ion implant depth, as defined by S. K. Ghandi, op. cit., is in the range 0.01–0.6 μm, and the implanted p type ion is concentrated in the p type implant region 23.

This step as illustrated in FIG. 1G is important to reduce the short channel, low threshold voltage effect described with reference to the prior art. As previously mentioned, it was believed that implant energies much above 30 keV to form the source and drain regions of a short channel transistor would produce unacceptably low threshold voltages $V_{th}$ in the transistor. This high energy (e.g. 150 keV) p-well implant solves that problem by allowing the use of implant energies substantially above 30 keV while still producing transistors with reasonable threshold voltages.

In FIG. 1H, the mask 21 is removed and a high temperature drive with a temperature T=700–1300° C. is applied for a time interval Δt=10–1000 minutes to drive the p type ions concentrated in the implant region 23 into a p-well 25 in the substrate 11 contiguous to the oxide layer 13'.

In FIG. 1I, a nitride layer 27 of $Si_xN_y$ (x≈3, y≈4) of thickness 0.05–0.35 μm is deposited over the exposed surface of the oxide layer 13' to serve as a temporary insulating layer.

In FIG. 1J, island masks 29A and 29B, spaced apart from each other, are formed over central portions of, but less than all of, the p-well 25 and the n-well 19, respectively. The material for the masks 29A and 29B may be photoresist material or some other suitable material.

In FIG. 1K, the portions of the nitride layer 27 not covered by the masks 29A or 29B are etched away and these masks are removed, leaving two spaced apart nitride islands 27A and 27B overlying central portions of the p-well 25 and n-well 19, respectively.

In FIG. 1L, an n-well mask 31 is formed over the nitride mask 27B and over most of the n-well 19, except for a small portion 34 of the n-well adjacent to an n-well/p-well interface 32. Portions 36A and 36B of the p-well 25 to the right and left, respectively, of the nitride mask 27A are also exposed, as shown.

In FIG. 1M, a p type ion implant (ion dose=$10^{12}$–$10^{14}$ atoms/cm$^2$; ion kinetic energies=10–200 keV; ions drawn from B, Al, Ga, BF$_2$ or a halogenated molecule thereof) is then carried out over the substrate, penetrating the non-masked portions thereof, i.e. the exposed portions of the oxide layer 13'. This produces two spaced apart p type isolation regions 33A and 33B, positioned above the n-well-well interface 32 and above a right hand boundary of the p-well 25, respectively.

In FIG. 1N, the n-well mask 31 is removed and oxide is grown over the previous oxide layer 13' by exposure of the apparatus to oxygen or H$_2$O at a temperature in the range T=850–1250° C. This will produce a field oxide layer 35 with the well known oxygen bulges, as shown in FIG. 1N, adjacent to the uncovered surfaces of the previous oxide layer 13', because of the 2.27:1 volume expansion of an oxidized region of silicon relative to unoxidized silicon (S. K. Ghandi, op. cit., pp. 377–383).

In FIG. 1O, the nitride masks 27A and 27B are then removed by etching or otherwise. In FIG. 1P, the thinner parts of the field oxide layer 35 are removed by an etching process, and an oxide layer 35', of thickness Δh=100–1,000 Å at its thinnest parts 35'A and 35'B, is grown on the exposed surfaces of the n-well 19 and p-well 25 at a temperature in the range T=800–1000° C.

In FIG. 1Q, a p type ion implant (ion dose=$10^{12}$–$10^{14}$ atoms/cm$^2$; ion kinetic energy=10–120 keV; ions drawn from B, Al, Ga, BF$_2$ or a halogenated compound thereof) is performed on the top surface of the device, for channel threshold adjustment purposes. This ion implant produces two p type channel regions 37A and 37B positioned at the top of the p-well 25 and n-well 19, respectively, contiguous to the thinnest parts 35'A and 35'B of the oxide layer 35'.

In FIG. 1R, an n-well mask 38 is formed over the n-well 19. In FIG. 1S, a p type ion implant (ion dose=$10^{12}$–$10^{14}$ atoms/cm$^2$; ion kinetic energy=10–120 keV; ions drawn from B, Al, Ga, BF$_2$ or a halogenated compound thereof) is then performed over the substrate, penetrating the p-well portion of the device, which is not covered by the n-well mask 38. This produces a p type channel region 39, adjacent to the oxide/substrate interface, that includes the earlier-formed p type implant layer 37A (see FIG. 1Q). The n-well mask 38 is then removed by etching or otherwise, as indicated in FIG. 1T.

In FIG. 1U, a layer 41 of polysilicon is then deposited over the exposed top surface of the device. Preferably, the layer 41 has a thickness in the range 0.2–0.5 μm An n type ion implant (ion dose=$5 \times 10^{15}$–$5 \times 10^{16}$ atoms/cm$^2$; ion kinetic energy=30–120 keV; ions drawn from P, As, Sb, Sn or a halogenated compound thereof) is performed on the poly Si layer 41 to provide initial doping, as illustrated in FIG. 1V. The implanted poly Si layer 41 is then annealed, producing an annealed poly Si layer 41'. Alternatively, the poly Si material can be doped with an p type or n type impurity, such as POCl$_3$, through a high temperature diffusion process. Preferably, the electrical resistivity of the doped poly Si layer 41' is in the range $10^{-4}$–$4 \times 10^{-3}$ Ohm-cm.

In FIG. 1W, masks 43A and 43B of a suitable mask material overlying central portions of the p-well 25 and the n-well 19, respectively, are provided. The remainder of the poly Si layer 41', except those regions overlain by the masks 43A and 43B, is etched away or otherwise removed, and the poly masks 43A and 43B are then removed, as illustrated in FIG. 1X. This produces two gate structures, including the poly Si gate layers 41A and 41B.

Figure 2A:
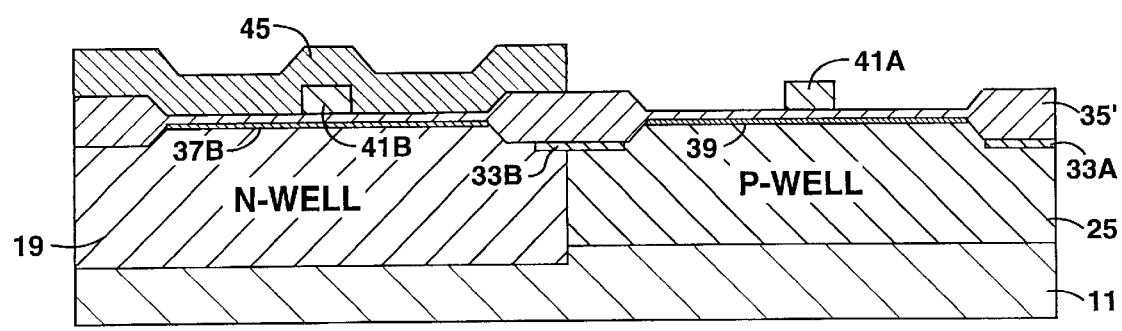
FIGS. 2A–2E illustrate ion implant steps performed in combination with the steps of FIGS. 1A–1X, according to a first embodiment of the present invention.

In FIG. 2A, an n-well mask 45 of photoresist or other suitable material is formed above the n-well 19 and above the poly gate 41B as shown, to shield the n-well from the ion implantation. For ion implant energies of 40–180 keV, the thickness of the mask 45 should be at least 0.8 μm.

Figure 2B:
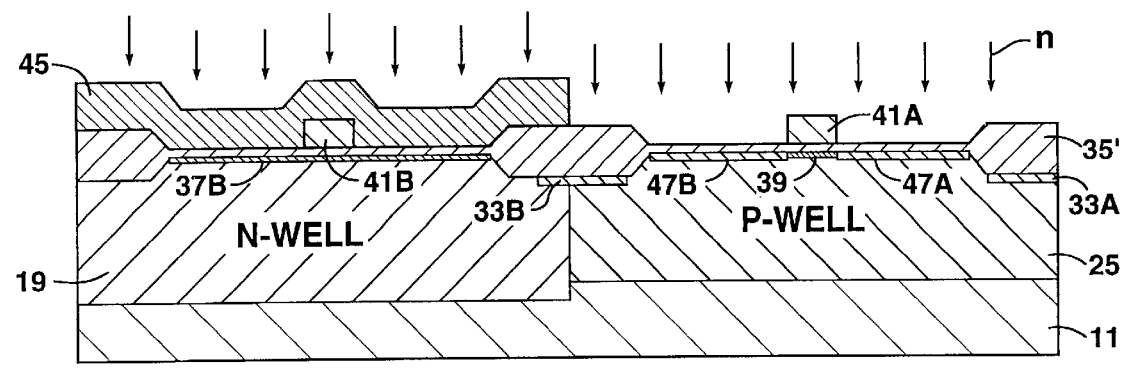

In FIG. 2B, an n type ion implant (ion dose=$5 \times 10^{12}$–$5 \times 10^{13}$ atoms/cm$^2$; ion kinetic energy preferably $\geq$40 keV; ions drawn from P, As, Sb, Sn or a halogenated compound thereof) is performed over the substrate, penetrating the p-well portion of the apparatus, with the n-well portion receiving virtually none of this n type ion implant due to mask 45. In the prior art, this ion implant step is performed with ion kinetic energies of 30 keV or less. This ultimately produces a peak substrate current of about 1.3 microamps/micron ("μAmps/μm"), which is too high for use in a semiconductor circuit with relevant dimensions 0.6 μm and less. The present invention uses ion kinetic energies of at least 40 keV (preferably 70–180 keV), which reduces the peak substrate current monotonically as the ion implant kinetic energy increases because the center of the high current path portion of the channel region 39 is thereby moved away from the oxide/substrate interface, into the interior of the silicon-based p-well 25 (or n-well 19, as the case may be). The ion implant illustrated in FIG. 2B produces two n- channel layers 47A and 47B flanking the p type channel region 39 to the right and left, respectively, within the p-well 25.

Figure 3:
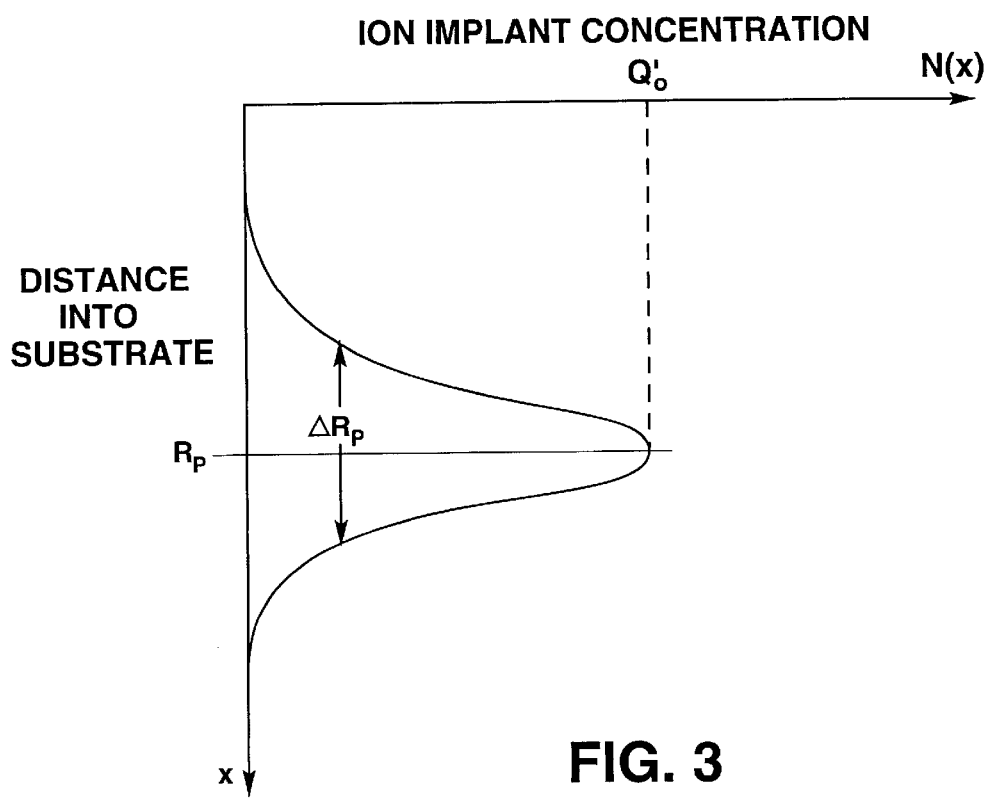
FIG. 3 is a graphical view illustrating the approximate distribution, as a function of a depth coordinate x, of ions of given kinetic energy that are implanted in a substrate material such as silicon.

According to the discussion of S. K. Ghandi, op. cit., pp. 299–321, the concentration N(x) of implanted ions in a semiconductor material versus a depth coordinate x indicated in FIG. 2B, measured perpendicular to the face of, and into, the material receiving the ions, is given approximately by the Gaussian or normal distribution $$N(x) = Q_0' \exp[-(x-R_p)^2/2(\Delta R_p)^2], \quad (1)$$

where $Q_0'$ is proportional to the ion dose (measured in ions/cm$^2$), $R_p$ is the average range of the implanted ions, and $\Delta R_p$ is the longitudinal straggle for the implanted ions. The distribution N(x) and the quantities $R_p$, $\Delta R_p$ and $Q_0'$ are illustrated in FIG. 3. The value $\Delta R_p$ is the statistical 1s-value for the Gaussian distribution N(x). Integrating the quantity N(x) over the range $R_p - \Delta R_p \leq x \leq R_p + \Delta R_p$ produces a well known numerical result for the Gaussian distribution; that is, $$\int_{R_p - \Delta R_p}^{R_p + \Delta R_p} N(x) dx = 0.685. \quad (2)$$

The average range $R_p$ and the longitudinal straggle $\Delta R_p$ increase at approximately the same rate with increase in the ion kinetic energy E, and the ratio $R_p/\Delta R_p$ is approximately constant with increasing values of E. For example, for implant of P ions in Si, $R_p$(E=30 keV)≈0.04 μm, $\Delta R_p$(E=30 keV)≈0.018 μm, $R_p$(E=40 keV)≈0.045 μm, $\Delta R_p$(E=40 keV) ≈0.0225 μm, $R_p$(E=50 keV)≈0.06 μm, $\Delta R_p$(E=50 keV) ≈0.027 μm, $R_p$(E=70 keV)≈0.091 μm, and $\Delta R_p$(E=70 keV) ≈0.043 μm. From Eq. (1), the fraction of implanted ions that lie within the 2s-range, given by $R_p - 2\Delta R_p \leq x \leq R_p + 2\Delta R_p$, is 0.9545, which is close to the maximum value of 1.0. The 2s-ranges for ion implantation with ion kinetic energies of 30, 50 and 70 keV become $E$=30 keV: 0.004 μm$\leq$x$\leq$0.076 μm, $E$=40 keV: 0.0045 μm$\leq$x$\leq$0.095 μm, $E=50$ keV: $0.005\ \mu m \leq x \leq 0.114\ \mu m$, $E=70$ keV: $0.006\ \mu m \leq x \leq 0.177\ \mu m$.

As the ion kinetic energy increases, the width of this 2s-channel increases, but the center coordinate of this 2s-channel increases faster. Consequently, as ion energy increases, the coordinate of the near edge (smallest value of the coordinate x) of this 2s-channel recedes from the gate oxide/ substrate interface (x=0) and the 2s-channel throughout which this doping occurs increases in width. Although the total current passing through a channel region extending from the gate structure into either an n-well or a p-well remains approximately the same, as kinetic energy of the implanted ions increases, the position of highest current density corresponding to this current is moved further and further into the n-well or p-well and the associated current density decreases, as desired for better control of the peak substrate current and current density.

Figure 2C:
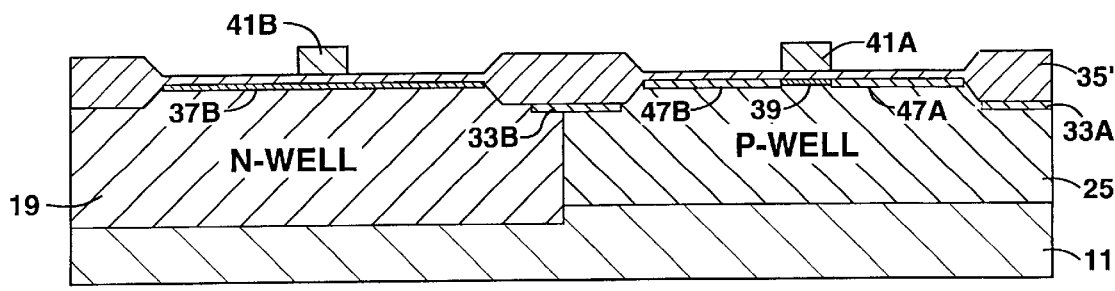
Figure 2D:
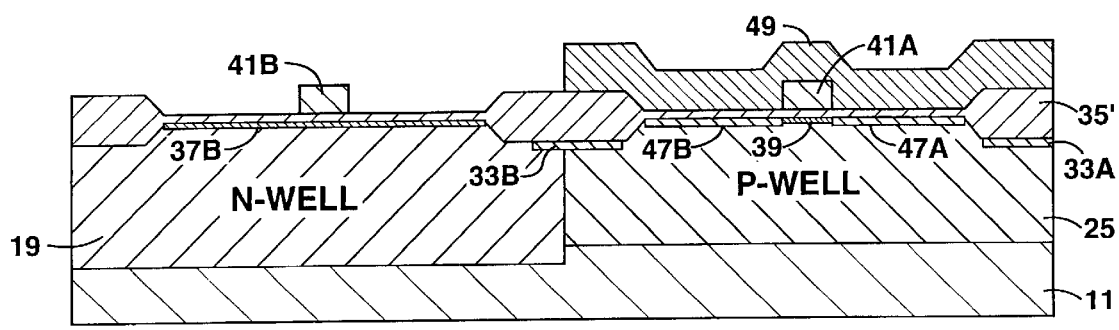

As seen in FIG. 2C, the n-well mask 45 is then removed, preferably by etching. A p-well mask 49, of photoresist or other suitable material, is formed above the p-well 25 and the poly gate 41A, as illustrated in FIG. 2D. The thickness of the mask 49 should be at least 0.8 $\mu m$.

Figure 2E:
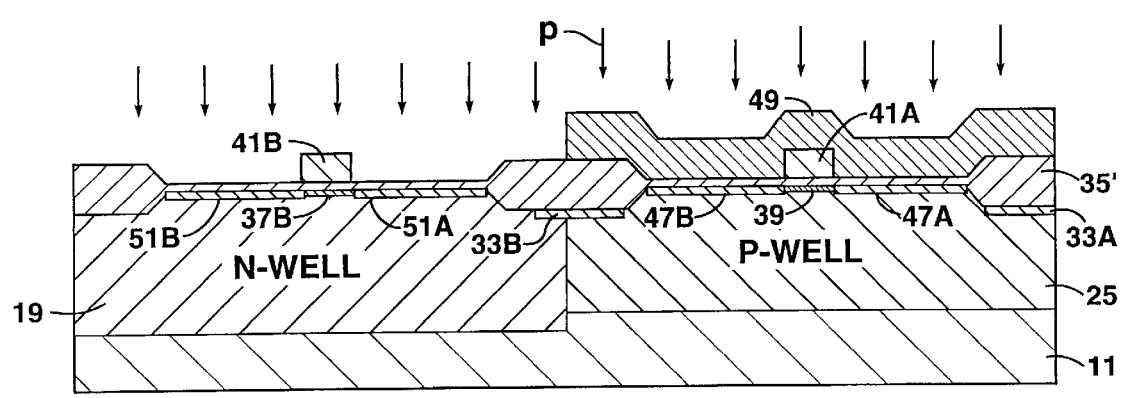

In FIG. 2E, a p type ion implant (ion dose=$10^{13}$–$5 \times 10^{14}$ atoms/cm$^2$; ion kinetic energy preferably=40–180 keV; ions drawn from B, Al, Ga, BF$_2$ or a halogenated compound thereof) is performed over tile substrate, penetrating the n-well portion 19. This produces two p-channels 51A and 51B flanking the n type channel 37B on the right and left, respectively, in the n-well 19. In the prior art, this step is performed with ion implant energies of 30 keV or less, as discussed above in connection with FIG. 2B, and produces peak substrate current that is too high for use in a semiconductor circuit with channel lengths of 0.6 $\mu m$ and less. The invention uses ion implant kinetic energies of at least 40 keV and preferably 70–180 keV to move the high current path portion of the channel region 37B away from the oxide/ substrate interface, as discussed above.

Figure 4A:
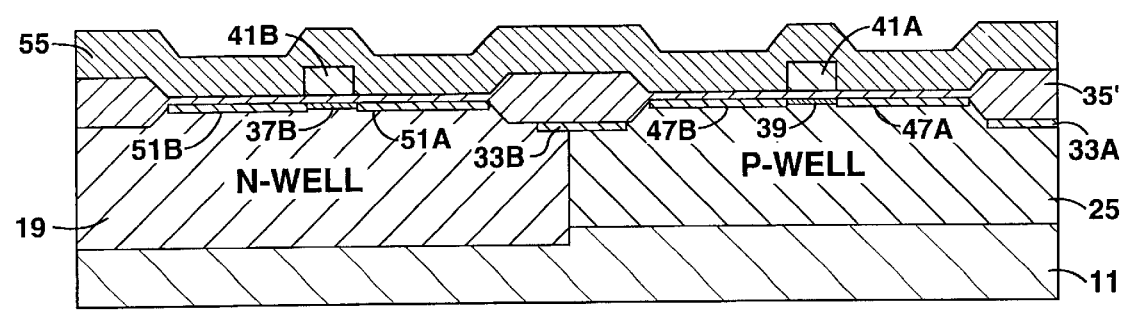
FIGS. 4A–4H illustrate optional additional steps in accordance with the present invention that may be performed after the ion implant operation of FIGS. 2A–2E has been completed.
Figure 4B:
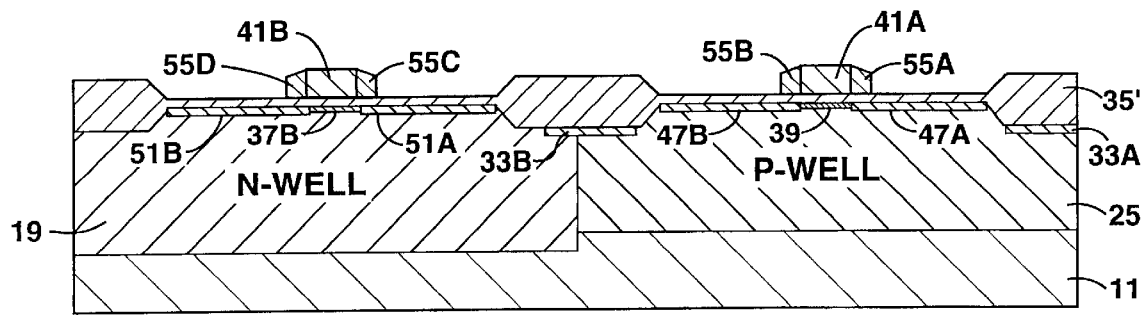

In FIG. 4A, a blanket oxide insulating layer 55 is deposited over the device. In FIG. 4B, most of this layer 55 is selectively etched away, leaving side wall insulating spacers 55A and 55B, of width 0.1–0.4 $\mu m$, flanking the poly Si gate 41A on the right and left and leaving side wall insulating spacers 55C and 55D, of width 0.1–0.4 $\mu m$, flanking the poly Si gate 41B on the right and left.

Figure 4C:
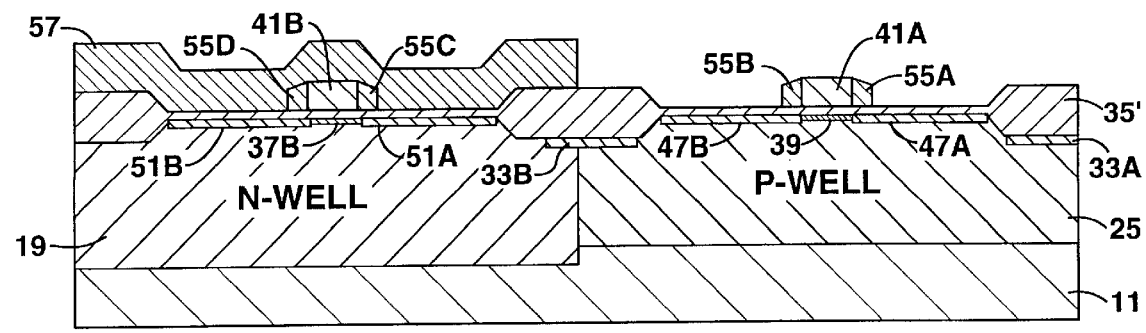
Figure 4D:
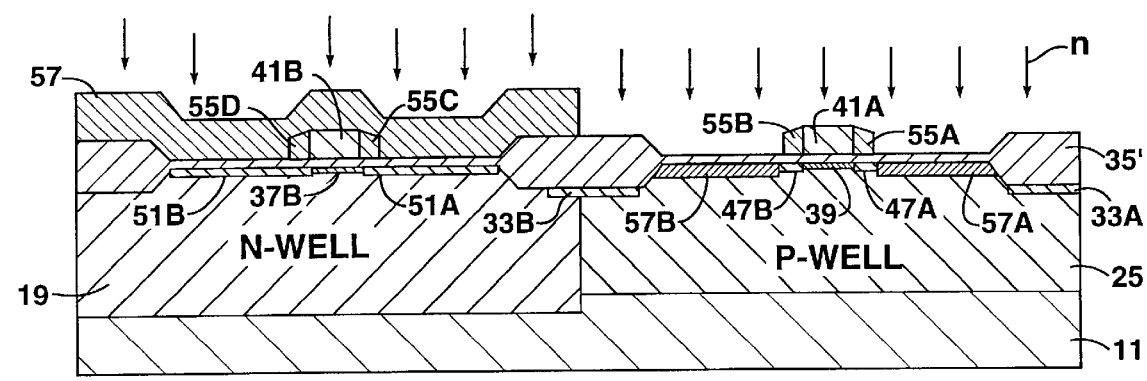

In FIG. 4C, an n-well mask 57, of photoresist or other suitable material, is formed over the n-well portion 19 of the apparatus. In FIG. 4D, an n+ ion implant (ion dose=$10^{15}$–$10^{16}$ atoms/cm$^2$; ion kinetic energy=40–180 keV; ions drawn from P, As, Sb, Sn or a halogenated compound thereof) is performed over the substrate, penetrating the p-well portion of the structure. The preferred range of ion implant kinetic energy is 50–180 keV. Below 70 keV, and more particularly below 50 keV, the effect of increased ion implant energy on reduced current density and suppression of the hot electron effect is less pronounced. Above 180 keV, the damage produced by the high energy implant ions requires extensive annealing to heal the damaged substrate material. This ion implantation produces channel layers 57A and 57B of increased n type doping. Two small source and drain regions, still denoted 47A and 47B in FIG. 4D, have reduced or lighter n type doping (n–) because these regions underlie the side wall spacers 55A and 55B, respectively, and are thus not appreciably implanted with the n type ions implanted in the step illustrated in FIG. 4D. The five regions, 57A, 47A, 39, 47B and 57B, thus have the dopings n+, n–, p, n– and n+, respectively. The n-well mask 57 is then removed by etching or otherwise.

Figure 4E:
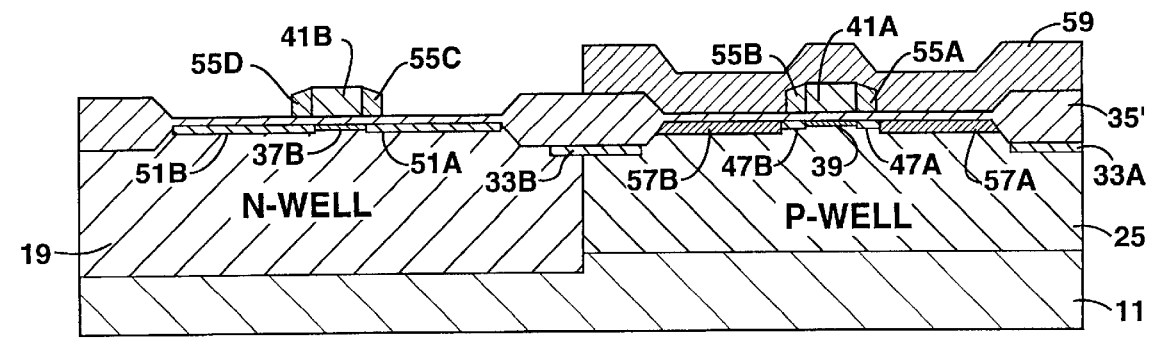
Figure 4F:
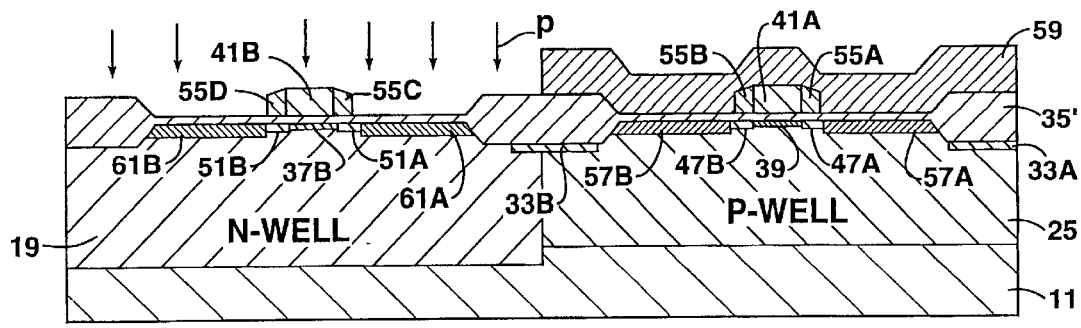
Figure 4G:
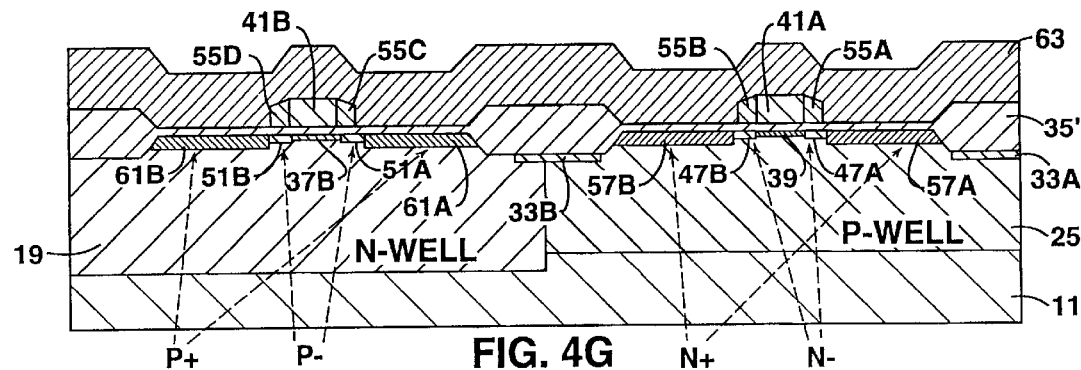

In FIG. 4E, a p-well mask 59 is formed over the p-well portion 25 of the device. In FIG. 4F, a p+ ion implant (ion dose=$10^{15}$–$8 \times 10^{15}$ atoms/cm$^2$; ion kinetic energy=20–150 keV; Ions drawn from B, Al, Ga, BF$_2$ or a halogenated compound thereof) is performed over the substrate, penetrating the n-well portion 19 of the device. This produces channel layers 61A and 61B of increased p type doping where the p-doped channel layers 51A and 51B, respectively, were positioned. Two small regions, still denoted 51A and 51B in FIG. 4F, have reduced p type doping (p–) because these regions underlie the side wall spacers 55C and 55D, respectively, and are thus not appreciably implanted with the p type ions implanted in the step illustrated in FIG. 4F. The five regions 61B, 51B, 37B, 51A and 61A thus have the respective dopings p+, p–, n, p– and p+. The p-well mask 59 is removed by etching or otherwise. In FIG. 4G, an insulating blanket oxide layer 63 is optionally formed over the device.

Figure 4H:
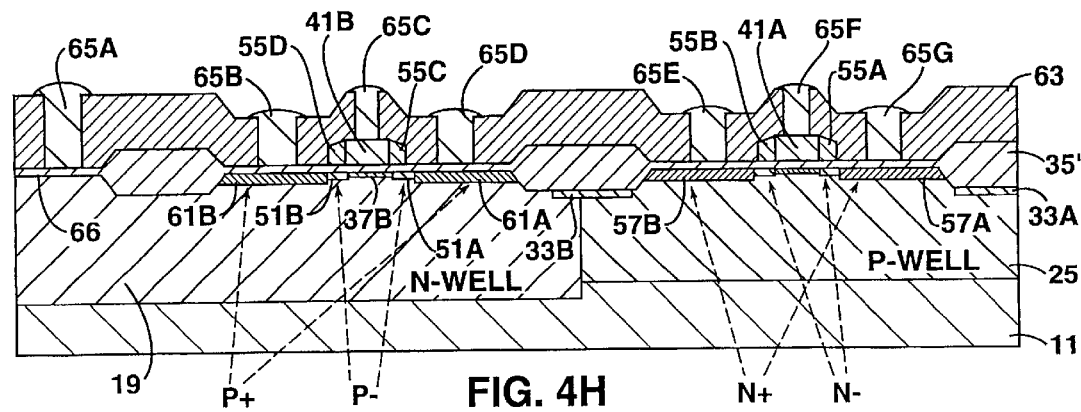

In FIG. 4H, approximately vertical apertures or vias 65A, 65B, 65C, 65D, 65E, 65F, 65G and 65H are selectively etched in the blanket oxide layer 63 and filled with metal to provide electrical contacts for the n-well 19, the drain region 61B, the gate 41B, the source region 61A, the drain region 57B, the gate 41A, the source region 57A and the p-well 25, respectively. An n+ region 66 is preferably provided between via 65A and the n-well 19.

The device shown in FIG. 2E, with the mask 49 removed, has been analyzed using the semiconductor behavior modeling software packages SUPREM-IV and PISCES to determine whether increase in ion implant kinetic energy from 30 keV to energies of at least 40 keV, preferably in the range 70–180 keV, in the process steps of FIGS. 2A–2E, will decrease the substrate current density adjacent to die gate structure by distributing the current over a wider "channel" by reason of the greater range of ions implanted across this interface into the substrate. The representative ion implant ranges of a p type ion such as boron for ion implant energies E=30 keV, 40 keV, 50 keV and 70 keV are, respectively, 0.11 $\mu m$, 0.145 $\mu m$, 0.18 $\mu m$ and 0.23 $\mu m$; and the representative ion implant ranges of an n type ion such as phosphorous for ion implant energies E=30 keV, 40 keV, 50 keV and 70 keV are, respectively, 0.04 $\mu m$, 0.05 $\mu m$, 0.06 $\mu m$ and 0.091 $\mu m$ (S. K. Ghandi, op. cit., pp. 299–321).

Figure 5:
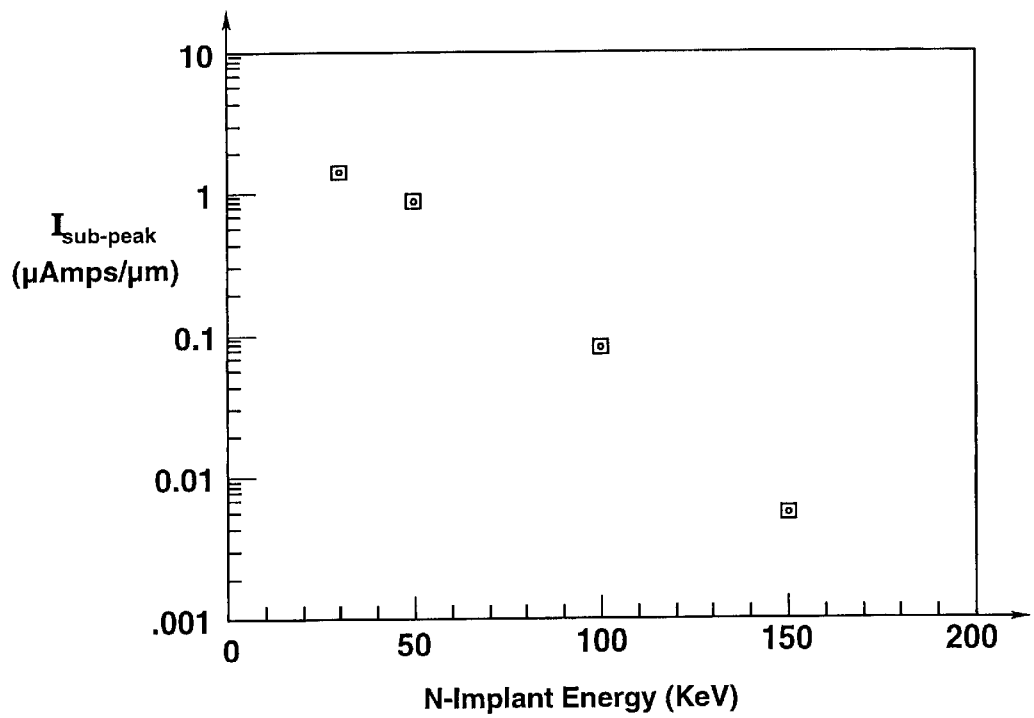
FIG. 5 is a graphical view illustrating a tendency of peak substrate current $I_{sub-peak}$ to decrease with increasing ion implant energy used in the steps illustrated in FIGS. 2A–2E.

FIG. 5 graphically illustrates one effect of use of higher ion implant energies in the process steps of the invention, as illustrated in FIGS. 2A–2E: the peak substrate current density and peak substrate current $I_{sub-peak}$ decreases monotonically as ion implant kinetic energy E increases. This decrease in $I_{sub-peak}$ with increasing ion implant kinetic energy appears to occur for an n-well implant and for a p-well implant and could be used separately for an n-channel transistor or for a p-channel transistor, or for a pair of complementary CMOS wells. The results illustrated in FIG. 5 indicate that use of ion implant energies of 50 keV or higher will reduce the peak substrate current density to 1 $\mu Amp/\mu m$ or less.

A result of the reduction of this peak substrate current density is a dramatic increase in lifetime of the associated drain-gate-source circuit. Use of a 30 keV ion kinetic energy produces a peak substrate current of about 1.3–1.5 $\mu Amps/\mu m$ and a corresponding lifetime of about 1,700 hours. Use of an 80 keV ion implant kinetic energy produces a peak substrate current of about 0.5–0.8 $\mu Amps/\mu m$ and a corresponding device lifetime of about 37,000 hours, an increase by a multiplicative factor of about 22 over the 30 keV situation. The device lifetime may increase by a multiplicative factor of 50 or more for some configurations using the invention.

In another embodiment of the invention, the steps 1A–1V are performed as before. An abbreviated sequence of steps is then performed to provide the desired lightly doped drain configuration, as illustrated in FIGS. 6A–6N described below.

Figure 6A:
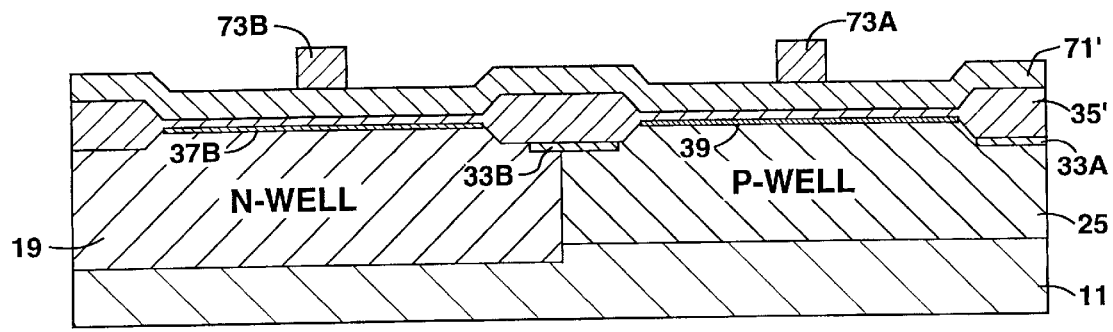
FIGS. 6A–6N illustrate another embodiment of the present invention.
Figure 6B:
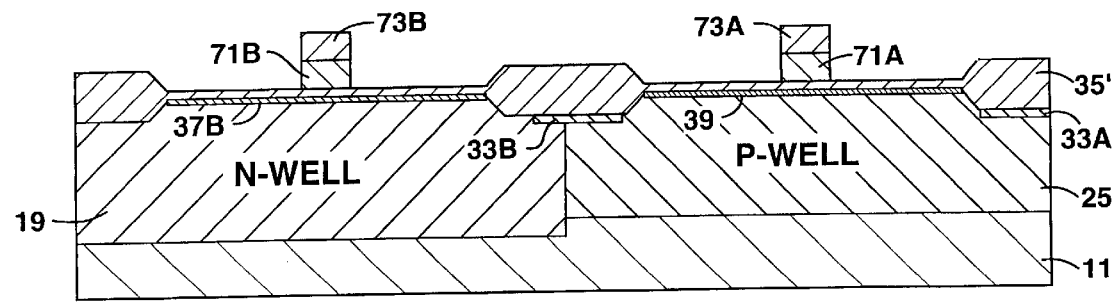

In FIG. 6A, photoresist masks 73A and 73B overlying central portions of the p-well and the n-well 19, respectively, are provided for the configuration shown in FIG. 1V. A poly Si layer 71', except those regions overlain by the photoresist masks 73A and 73B, is etched away or otherwise removed, but the photoresist masks 73A and 73B are not removed, as illustrated in FIG. 6B. This produces two poly Si gate structures 71A and 71B, as shown in FIG. 6B, overlying central portions of the p-well and n-well, respectively, and overlain by the two respective photoresist masks 73A and 73B.

Figure 6C:
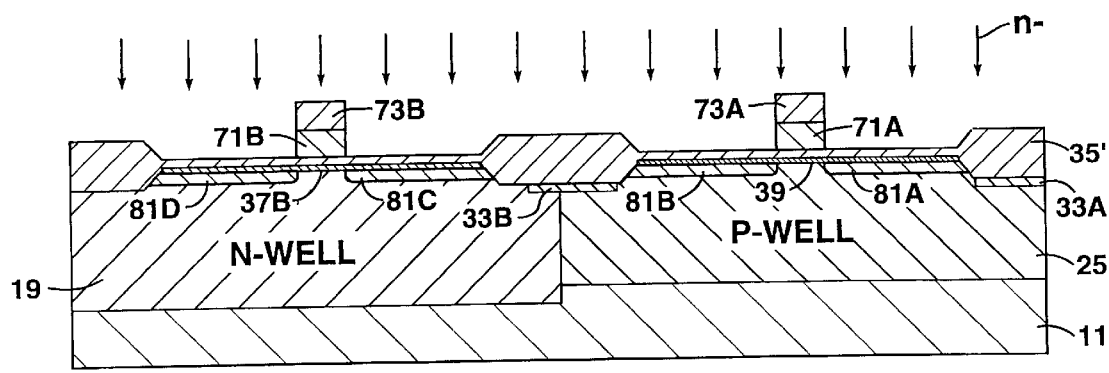

In FIG. 6C, an n– ion implant (ion dose=$5 \times 10^{12}$–$5 \times 10^{13}$ atoms/cm$^2$; ion kinetic energy $\geq 50$ keV; ions drawn from P, As, Sb, Sn or a halogenated compound thereof) is performed on the substrate and the substrate is annealed. As noted above, this ion implant was normally performed by conventional processes with relatively low ion kinetic energies≈30 keV, and this ultimately produced an excessive peak substrate current of about 1.3 $\mu$Amps/$\mu$m. However, use of ion kinetic energies greater than 30 keV (preferably, in the range 50–150 keV) appears to reduce the peak substrate current monotonically as the ion kinetic energy increases, by moving the high current portion of the path away from the oxide/substrate interface. This ion implant produces two n-channel regions 81A and 81B flanking the p type channel region 39 to the right and left, respectively, within the p-well 25; and two n– channel regions 81C and 81D flanking the n type channel region 37B to the left and right, respectively.

Figure 6D:
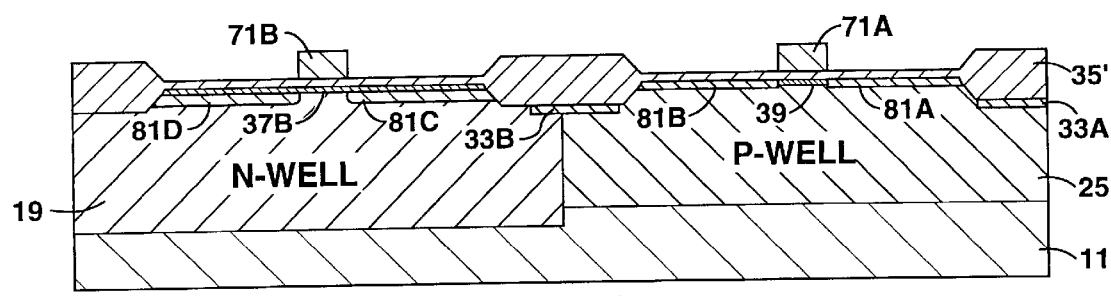
Figure 6E:
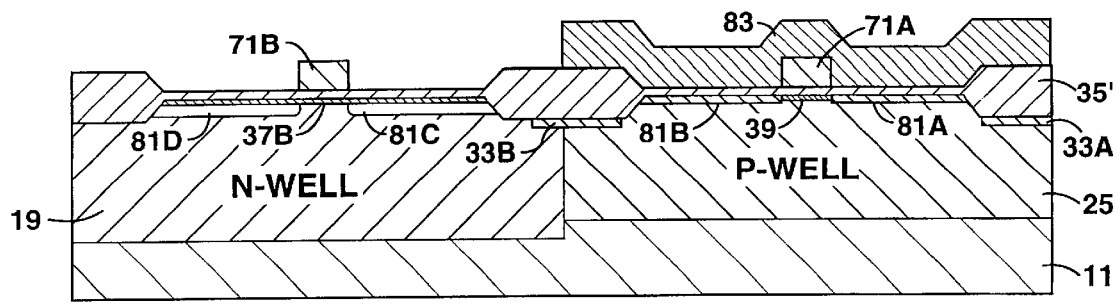

The photoresist masks 73A and 73B are then removed, as illustrated in FIG. 6D. A p-well mask 83 is then formed over the p-well region 25, as illustrated in FIG. 6E.

Figure 6F:
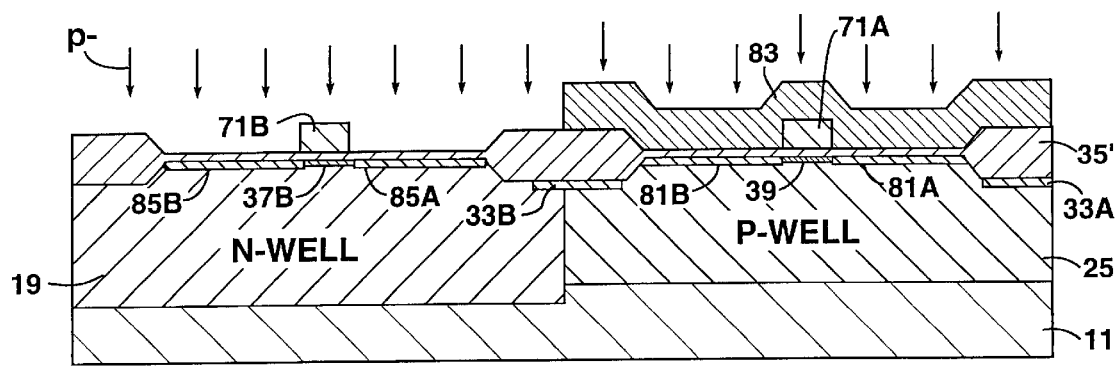

In FIG. 6F, a p– ion implant (ion dose=$7 \times 10^{12}$–$5 \times 10^{14}$ atoms/cm$^2$; ion kinetic energy $\geq 50$ keV; ions drawn from B, Al, Ga, BF$_2$ or a halogenated compound thereof) is performed over the substrate, penetrating the n-well portion of the device. This produces two p-channels 85A and 85B flanking the n type channel 37B on the right and left, respectively, in the n-well 19. The n-well mask 83 is then removed by etching or otherwise.

Figure 6G:
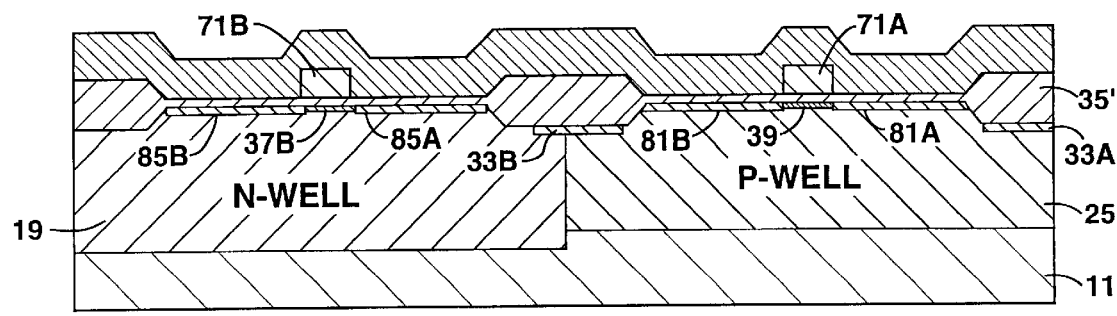
Figure 6H:
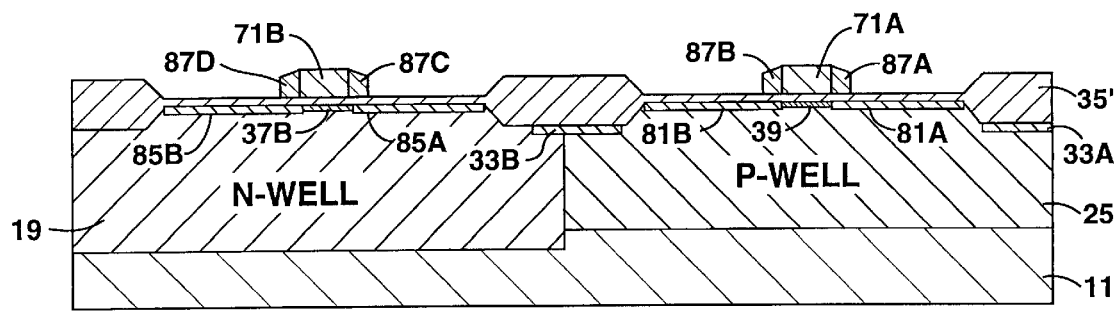

In FIG. 6G, a blanket oxide insulating layer 87 is deposited over the device. In FIG. 6H, most of this layer is selectively etched away, leaving side wall insulating spacers 87A and 87B, of width 0.1–0.4 $\mu$m, flanking the poly gate 71A on the right and left, and leaving side wall insulating spacers 87C and 87D, of width 0.1–0.4 $\mu$m, flanking the poly gate 71B on the right and left.

Figure 6I:
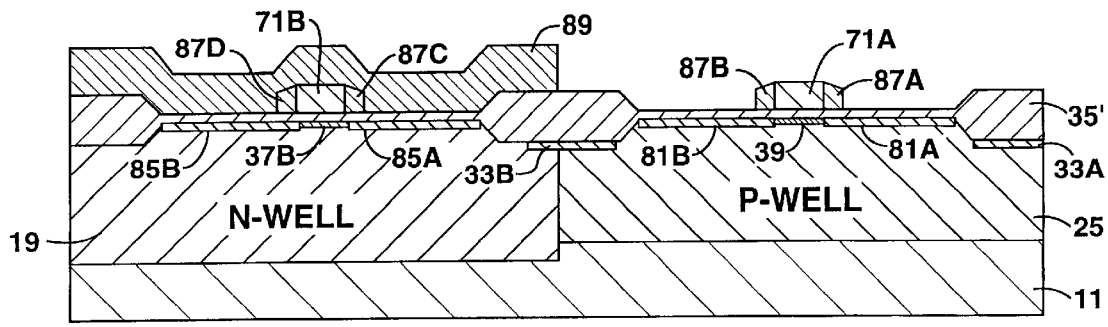
Figure 6J:
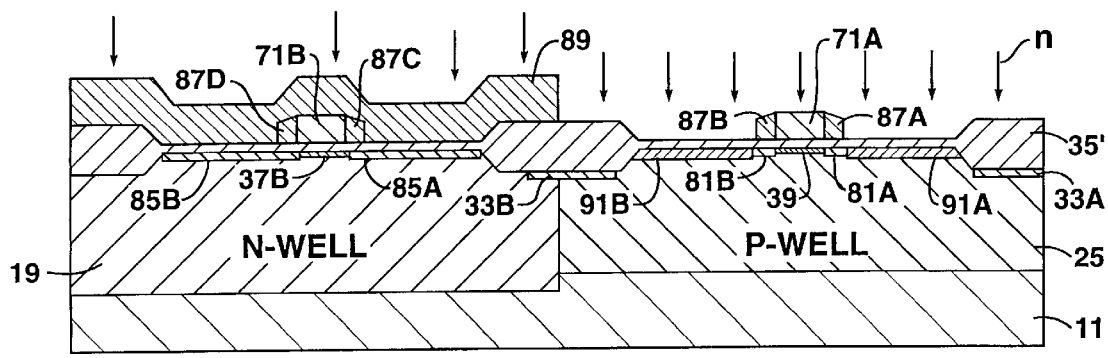

In FIG. 6I, an n-well mask 89 is formed over the n-well portion 19 of the device. In FIG. 6J, an n+ ion implant (ion dose=$10^{15}$–$10^{16}$ atoms/cm$^2$; ion kinetic energy=40–180 keV; ions drawn from P, As, Sb, Sn or a halogenated compound thereof) is performed over the substrate, penetrating the p-well portion of the device. This ion implantation produces channels 91A and 91B of increased n type doping concentration where the n-doped channels 81A and 81B, respectively, were positioned. Two small regions, still denoted 81A and 81B in FIG. 6J, have reduced n type doping (n–) because these regions underlie the side wall spacers 87A and 87B, respectively. The regions 91B, 81B, 39, 81A and 91A thus have the doping n+, n–, p, n– and n+, respectively. The n-well mask 89 is then removed by etching or otherwise.

Figure 6K:
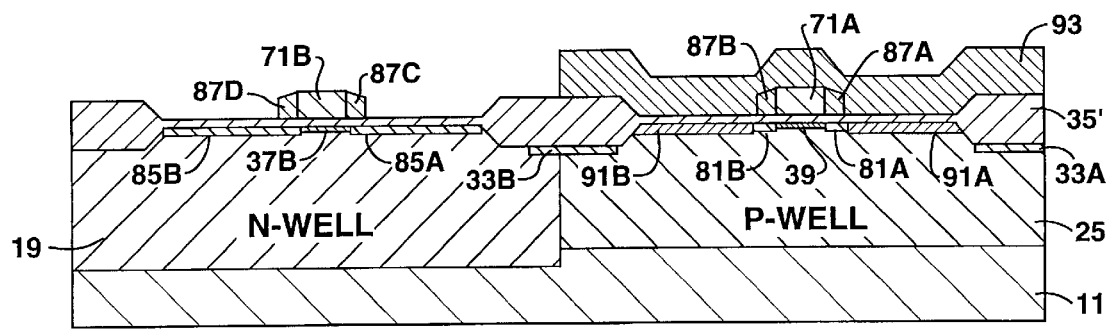
Figure 6L:
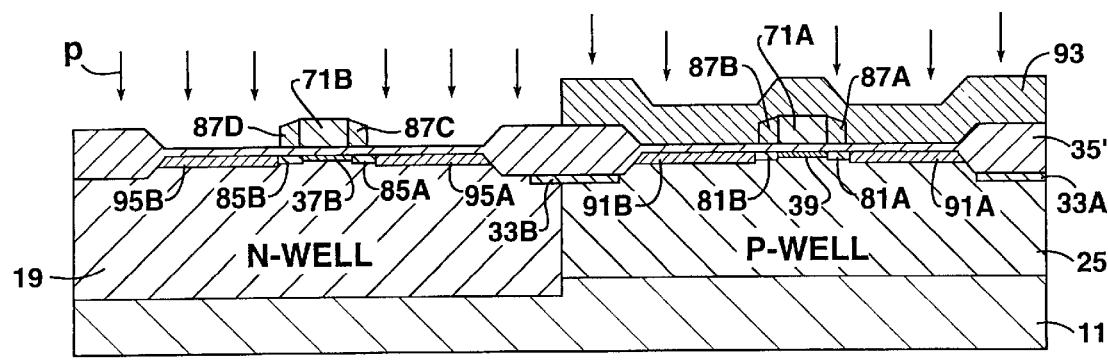

In FIG. 6K, a p-well mask 93 is formed over the p-well portion 25 of the device. In FIG. 6L, a p+ type ion implant (ion dose=$10^{15}$–$8 \times 10^{15}$ atoms/cm$^2$; ion kinetic energy= 20–150 keV; Ions drawn from B, Al, Ga, BF$_2$ or a halogenated compound thereof) is performed over the substrate and into the n-well portion of the device. This produces channels 95A and 95B of increased p type doping concentration where the p-doped channels 85A and 85B, respectively, were positioned. Two small regions, still denoted 85A and 85B in FIG. 6L, have reduced p type doping (p–) because these regions underlie the side wall spacers 87C and 87D, respectively, and are thus not further implanted with the p type ions in the step illustrated in FIG. 6L. The five regions 95B, 85B, 37B, 85A and 95A thus have the respective doping p+, p–, n, p– and p+. The p-well mask 93 is removed by etching or otherwise.

Figure 6M:
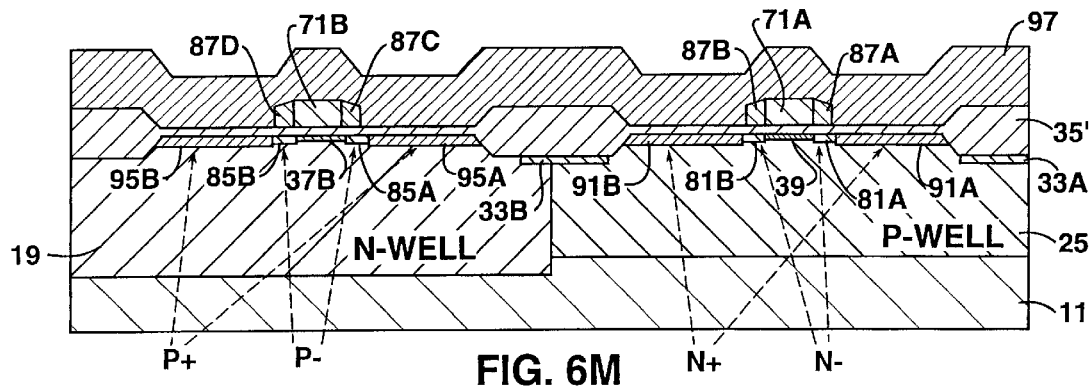
Figure 6N:
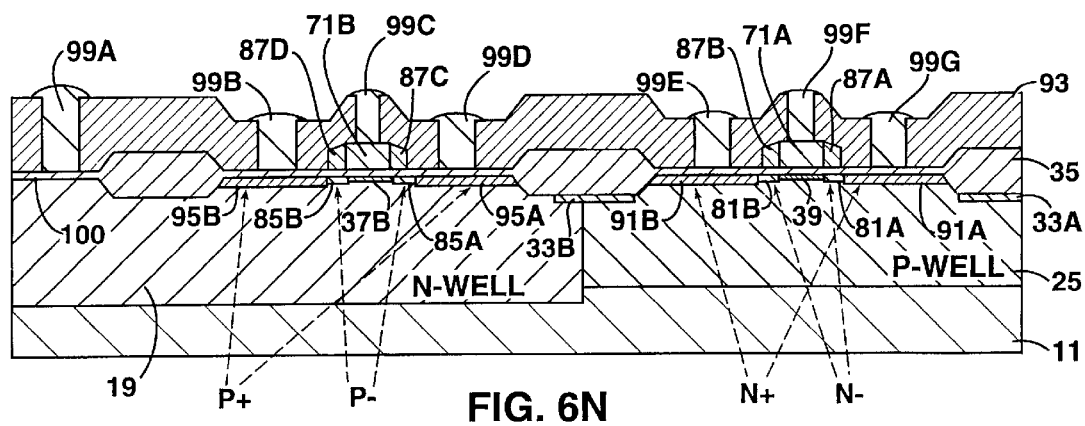

In FIG. 6M, an insulating layer 97 is optionally formed over the device. In FIG. 6N, approximately vertical apertures or vias 99A, 99B, 99C, 99D, 99E, 99F and 99G are selectively etched in the oxide layer 97 and filled with metal, such as Al or Ti, or other electrically conductive material to provide electrical contacts for the n-well 19, drain 95B, gate 71B, source 95A, drain 91B, gate 71A, source 91A. An n+ region 100 is preferably provided between via 99A and the n-well 19. A via similar to 99A can also be provided for p-well 25.

Figure 7:
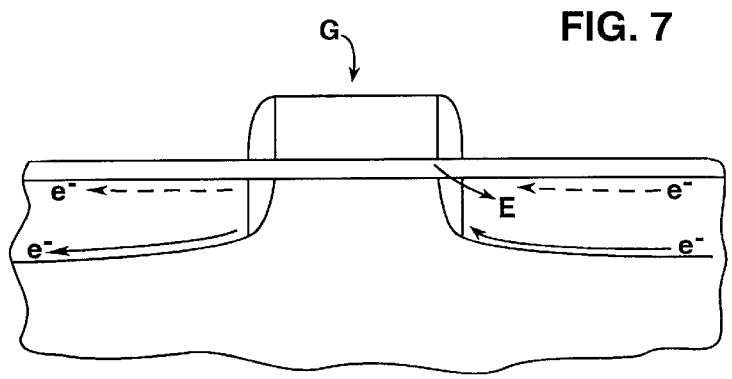
FIG. 7 illustrates the improved operation of an NMOS transistor of the present invention.

FIG. 7 is used to illustrate improvements provided by tile present invention. The ion implant energies of at least 40 keV used to form the source and drain regions on opposing sides of the gate region G of an NMOS transistor creates a deeper, wider path for the electrons e$^-$ (the minority carriers) in those regions as illustrated by the solid arrows. In the prior art, the lower energy implants created shallower, narrower paths for the electrons, as illustrated with the dashed arrows. The E field created by the application of a voltage to the gate G is much more likely to affect the minority charge carriers of the prior art, which flow nearer to the surface, than the minority charge carriers flowing through the structure of the present invention. In consequence, the method and structure of the present invention greatly reduces the hot electron effect while reducing substrate current density.

Although this invention has been described in terms of several preferred embodiments, alterations, modifications and permutations thereof will become apparent to those skilled in the art upon a reading of the specification and a study of the drawings. It is intended that the following claims include all such alterations, modifications and permutations that fall within the spirit and scope of the present invention.

What is claimed is:

1. A method of fabricating a device on a semiconductor substrate, the method comprising the following steps:

providing a first well of a first conductivity type and a second well of a second conductivity type that is opposite the first conductivity type, both the first and second wells having exposed surfaces on the semiconductor substrate, the first and second wells being formed at implant energies between about 150 and 400 keV;

providing an on the exposed surfaces of the first and second wells;

providing a first gate structure and a second gate structure on the oxide layer and overlying central portions of the first and second wells, respectively;

performing a first LDD implant with ions of the first conductivity type having an ion kinetic energies of at least about 70 keV and having a first ion dose in the range of about $5 \times 10^{12}$–$5 \times 10^{13}$ atoms/cm$^2$, said step of performing the first LDD implant being conducted concurrently in the first and second wells such that portions of the second well that do not underlie the second gate structure are converted to first LDD layers of the first conductivity type;

protecting the second well and the second gate structure from ion implantation;

performing a second LDD implant with ions of the second conductivity type having ion kinetic energies of at least about 70 keV and having a second ion dose in the range of about $7\times10^{12}$–$5\times10^{14}$ atoms/cm$^2$, said step of performing the second LDD implant being conducted in the first well such that portions of the first well that do not underlie the first gate structure are converted to second LDD layers of the second conductivity type; and performing separate implants in the first and second wells with ions having ion kinetic energies in the range 40–180 keV and having an ion dose in the range $10^{15}$–$10^{16}$ atoms/cm$^2$ to form completed sources and drains in the first and second wells.

2. The method of claim 1 wherein the step of providing the first gate structure and the second gate structure includes the following steps:

forming a polysilicon layer on the oxide layer;

forming a mask on the polysilicon layer to protect portions of the polysilicon layer located at the first and second gate structures; and etching the polysilicon layer to form the first gate structure and the second gate structure.

3. The method of claim 2 wherein the mask formed over the polysilicon layer is left on the first gate structure and the second gate structure during the step of performing the first LDD implant.

4. The method of claim 1 wherein the step of performing the first LDD implant is conducted at an ion dose in the range of about $2\times10^{13}$–$5\times10^{13}$ atoms/cm$^2$.

5. The method of claim 1 wherein the step of performing separate implants in the first and second wells includes a step of forming spacers on the side walls of the first gate structure and the second gate structure before performing said separate implants in the first and second wells.

6. The method of claim 1 wherein the first conductivity type is n-type.

7. The method of claim 4 wherein the step of performing the second LDD implant is conducted at the second ion dose of between about $2\times10^{13}$–$5\times10^{14}$ atoms/cm$^2$.

\* \* \* \* \*